(12) United States Patent
Ilyanok

(10) Patent No.: US 7,282,731 B2
(45) Date of Patent: Oct. 16, 2007

(54) QUANTUM SUPERMEMORY

(76) Inventor: Alexandr Mikhailovich Ilyanok, Zhukovsky Street, 10-1-72, Minsk, 220007 (BY)

( * ) Notice: Subject to any disclaimer, the term of this patent is extended or adjusted under 35 U.S.C. 154(b) by 216 days.

(21) Appl. No.: 10/482,351

(22) PCT Filed: Jul. 1, 2002

(86) PCT No.: PCT/EA02/00007

§ 371 (c)(1),
(2), (4) Date: Oct. 18, 2004

(87) PCT Pub. No.: WO03/003467

PCT Pub. Date: Jan. 9, 2003

(65) Prior Publication Data

US 2005/0068805 A1 Mar. 31, 2005

(30) Foreign Application Priority Data

Jun. 29, 2001 (RU) ............................... 200100847

(51) Int. Cl.
*H01L 47/00* (2006.01)
(52) U.S. Cl. .................. 257/4; 257/9; 257/E49.001; 977/932
(58) Field of Classification Search .................. 257/9, 257/4, E49.001; 977/932
See application file for complete search history.

(56) References Cited

U.S. PATENT DOCUMENTS 4,697,224 A    9/1987  Watanabe et al.
5,018,180 A    5/1991  Shoulders
5,300,272 A    4/1994  Simandl et al.
5,389,567 A    2/1995  Acovic et al.
5,420,746 A    5/1995  Smith
5,557,497 A    9/1996  Ivanov et al.
5,667,637 A    9/1997  Jewell et al.
5,856,907 A    1/1999  Gabbai
6,180,252 B1   1/2001  Farrell et al.
6,570,224 B1   5/2003  Ilyanok
2004/0257302 A1 12/2004  Ilyanok
2006/0097302 A1  5/2006  Ilyanok

FOREIGN PATENT DOCUMENTS

WO    WO0041247    * 7/2000
WO    WO03003467   * 9/2003

* cited by examiner

*Primary Examiner*—B. William Baumeister
*Assistant Examiner*—Matthew L. Reames
(74) *Attorney, Agent, or Firm*—Brooks Kushman P.C.

(57) ABSTRACT

A quantum supermemory is based on the cells of nanostructured material. The nanostructured material includes consists of clusters with tunnel-transparent coatings. The clusters have sizes at which resonant electron features are manifested. The size is determined by the circular radius of the electronic wave, according to the formula $r_0 = \hbar/(m_e \alpha^2 c) = 7.2517$ nm, where $\hbar$ is the Plank contstant, $m_e$ is the electron mass, $\alpha = 1/137,036$ is the fine structure constant, c is the speed of light. The cluster size is set within the range $r_0 = 4r_0$, and the width of the tunnel-transparent gap is less than $r_0 = 7.2517$ nm. The nanostructured material stores energy (charge) uniformly along its whole volume with the specific density of $1.66 \times 10^3$ J/cm$^3$. Based on this material energy-independent rewritable memory is obtained with the writing density up to 28 Gbyte/cm$^2$, the maximum working temperature being 878° C. and the maximum timing frequency being 175 Ghz.

15 Claims, 2 Drawing Sheets

QUANTUM SUPERMEMORY

BACKGROUND OF THE INVENTION

1. Field of the Invention

The invention relates to the field of electronic components and informatics and can be used in production external and operative memory, computing and every possible information device.

2. Background Art

In the near future, the main problem of the development of multimedia technology will become processing and accumulating terabit volumes of information. Carriers of information, existing at present, like magnetic, optical and silicon carriers, nearly run out all possibility, both in physical, and in economic plan. Known methods of recording information are based on the principle of modulation of the electron or photon stream, interacting with a medium—a carrier of information.

A prevalent method of information storage is information storage on an electric capacitor or information storage directly in the dielectric of the capacitor on introduced defect—an electron traps [1].

In connection with an advanced stage of development of silicon technology usually for information storage capacitors with dielectrics from $SiO_2$, $Si_3N_4$ and so on are used. They have low permittivity $\epsilon=4$ but high field strength E under which the dielectric breakdown occurs. The field strength will reach $E=3*10^7$ V/cm in the thin 15 nm film due to decrease of defects [1, chapter 7.3.4]. In such capacitors, specific density of energy of information storage is of the order $W=3.5*10^2$ J/cm3. However, it is really impossible to achieve such energy density because of the oxide film is directly found on the semiconductor.

For instance, in the system Si—$SiO_2$, when the field in silicon reaches the value to be typical of avalanche breakdown $3*10^5$ V/cm, the corresponding field in oxide approximately is three times more (~$10^6$ V/cm) because $\epsilon_{Si}/\epsilon_{SiO2}=11.7/3.9$ [1, chapter 7.3.4]. This effect at least reduces density of energy accumulated in the capacitor to one order. High energy density of information storage allows the ratio of the useful signal to noise to increase and, consequently, the record information density to increase to 1 $Gbit/cm^2$. However, high leakage currents are formed because of small film thickness.

For instance, under the field $E=6* 10^6$ V/cm the density of the leakage current is ~$4*10^{-11}$ $A/cm^2$. Note that leakage currents depend on operating temperature of the instrument exponentially. Besides, the decreasing of the film thickness below 8 nm results in tunnel current appearance in the capacitor. Consequently, these effects limit the time of the charge storage and operating temperature range. So during process of information storage, for instance, in temporary memory, it is necessary to restore the charge periodically—to regenerate. In such mode the dead time necessary on charge regeneration appears, and power consumption of operating memory sharply rises. Besides, such memory loses information when power is off.

To make the energy-independent memory semiconductor FET with enough thickness dielectric layer of control gate are used. The dielectric is made as multi-layer one or defects or additional electrodes are introduced in it. Special control impulse being applied, the dielectric is disrupted and charges are carried in it. They are trapped in the dielectric and can be stored quite long. This charge changes the static properties of the transistor that is used for identification of information in each cell. However, such cells appear to be quite large. This limits the possibility of the making the integrated circuit of large capacity [1,2].

The analog memory with serial access on the base of charge-coupled devices (CCD) is broadly used except in digital integral circuits with random access. They are usually used in photo and television detectors for transformation of the image in digital form. The metal-oxide-semiconductor (MOS) capacitor working in the mode of deep carrier depletion is the main element of a charge-coupled device. This device includes a semiconductor substrate covering by uniform layer of the insulator (the oxide), on which gates—transfer electrodes are located quite close to each other.

Here information as charge packet moves consecutively from cell to cell along the surface under the action of clock pulses applied to transfer electrodes. However, the number of the information shifts is limited by several thousand. In future charge packet degrades. With the clock rate being increased over $10^7$ Hz, the charge packets also degrade. As a result, analog information is lost. If charge-coupled devices are used in the mode of digital information storage, connected information in charge-coupled devices, it is possible to recover periodically the charge as "1" and "0". Clear the presence of one fault cell in the memory line falls out of the whole line. Therefore, the process of production charge-coupled devices is quite expensive.

Besides, charge in charge-coupled devices is kept in quite a large area—in the depletion located under oxide layer of the semiconductor. This reduces the specific energy of information storage in several orders in contrast with temporary memory with random access, that does not allow the cell size to decrease and the recording density of information above 10 $Megabit/cm^2$ to be achieved. As the result, these devices have not found wide application for making the external memory because of high cost of the unit information storage [1].

To increase the density of recording of information over 1 $Gbit/cm^2$ it is necessary to reduce the size of a storage cells up to sizes, allowing to keep one electron [3,4]. However, experiments have shown that miniaturizing of the cell results in decreasing of the working temperature less than 4K. This is related with that fact that the miniaturizing of the cells of active element simultaneously increases stray permittivity of control electrodes. This accordingly increases the stray noise charge, which destroys useful information keeping in a cell [5].

In this regard, the question, whether it is possible to create the energy-independent memory on capacitor with large specific energy of information storage for obtaining high writing density of information, simultaneously working in wide temperature range and fast response, arises.

The electric capacitors on the base of solid dielectrics, having large specific capacity are known, for instance, capacitors on $BaTiO_3$ dielectric have large permeability $\epsilon>1000$ and specific capacity on the order of 0.3 $F/cm^3$. Different methods are used for increasing of specific capacity. The most efficient is the nanostructuring of dielectrics of the type $BaTiO_3$ by way of the creation of nanosize clusters with shell [6], or the creation of thin nanosize films with doping by metal [7].

By means of such approach, as the authors confirm, it was managed to increase permittivity up $\epsilon=10^5-10^6$ and to reach specific capacity 100-1000 $F/cm3$. As the result, it was managed to obtain the specific energy, accumulated in the capacitor on the order of $10^2-1.3*10^4$ $J/cm^3$. In the capacitor, made on the enumerated above patent, barium titanate is used with a high degree of metal doping. This results in transformation of dielectric to semiconductor. As the result, large leakage currents appear resulting in quick loss of the accumulated energy. Besides, the process of the cracking 100 nm film begins after increasing the energy density over $10^3$ J/cm$^3$. Consequently, the use of such capacitors for long-term keeping of the energy is not effective.

In the solid-state capacitors enumerated above, ion transfer mechanisms are used. So, in BaTiO$_3$, ions are shifted relatively to the crystal lattice. Such process of the heavy ion moving limits the speed properties. So, it is impossible to use such capacitors in memory elements of very-high-speed integrated circuits.

SUMMARY OF THE INVENTION

The aim of the invention is the creation of memory cells with extreme accessible parameter:

the writing density of information, the circulation velocity of information, the time of information storage, and the operating temperature.

On the base of the cells the creation of operating memory with random access and external memory with serial access is planed. At the same time it is supposed to use existing modern technology of electronic industry which achieves at present lithography resolution of 130 nm. With improvement of the lithography resolution to 15-30 nm the consequent transition at the extreme accessible parameter limited by fundamental laws of physics are expected.

To increase signal-noise ratio it is necessary to increase the specific energy density of information storage. The increase of specific energy density of information storage is possible by two ways: either increasing $\epsilon$ or, more effectively, increasing the field strength E because energy increases as $E^2$. However, the increase of E results in the irreversible dielectric breakdown [8].

The solid dielectric breakdown takes place due to electron emission in the dielectric from capacitor plates. For instance, in SiO$_2$ films under a field on the order of $3*10^5$ V/cm, the electron and the hole conductions are small. However the drift of mobile ions already can take place in oxides under these fields which results in the instability of the devices properties. The tunnel effects appear in nanometer layer by thickness lower than 8 nm. Note that usually conductivity of Si$_3$N$_4$ and Al$_2$O$_3$ greatly exceeds the conductivity of SiO$_2$.

In thick micrometer dielectrics at the voltage over $3*10^5$ V/cm, the emitted in dielectric electrons are moving from the cathode to the anode under action of an accelerating electrical field. On the trace they have multiple impacts that results in formation of an electron avalanche, i.e., dielectric breakdown. Because of impact ionization, the positive ions remaining in an avalanche trace and forming a residual charge are created. Besides, there is the possibility of activations of electrons are trapped in the material of dielectric, which also take part in avalanche breakdown. Besides at the increase of dielectric thickness there is a so-called bulk effect, i.e., dielectric breakdown voltage is slumped, that results in decreasing of storage energy density. Avalanche breakdown results in destruction of a material of the dielectric and forms a defective channel, which is not restored. In result, the capacitor is out of action.

There are many theories of the mechanism of irreversible dielectric breakdown [8]. However, all of them solve only separate partial tasks by approached ways.

The essence of the invention is the creation of the new mechanism of the accumulation of energy in all volume of solid-state dielectrics due to the control of mechanism breakdown and restoration of operating parameters of the dielectric material.

In the disclosed invention, with the purpose of the simultaneously increasing $\epsilon$ and E, it is proposed to use the new mechanism of electron movement in dielectric and semiconductors in view of spatial structure of an electron wave, published in the PCT Application [5].

In this work is shown, that the electron form—its charging wave, changes depending on the speed of electron movement and the structure of a material, in which the electron moves. In the simplest cases, the electron form can be presented as charged tore, rotating about the axis [5]. The electron in the minimum of the energy is possible to present as thin uniformly charged ring with a charge e, rotating about an axis with speed $\alpha^2 c$, where $\alpha$—constant of fine structure, and c—speed of light. The electrostatic field of such electron is concentrated in its plane, i.e., it represents the transverse charged wave. In result, the section of interaction between such electrons is minimal. It is possible to observe such electron state in vacuum at its movement with speed relatively laboratory system of coordinates less $\alpha^2 c$ or at its movement in superconductors or thin dielectric films on a surface of the semiconductor at low temperatures (quantum Hall effect) [5]. The diameter of such electron is determined from experiment on electron "tunneling" through a vacuum interval. It is experimentally established, that the tunnel effect disappears at distance between electrodes about 8 nm [1, chapter 9.4], [9, chapter 3]. This extremely important experimental fact is constantly ignored.

Nevertheless, it is possible to determine this size theoretically too. Consider that the radius of such ring electron is connected with fundamental constants as [5]:

$$r_0 = \hbar/(m_e \alpha^2 c) = 7.2517 \text{ nm}. \tag{1}$$

The proposed theoretical model of a ring electron gives the new approach in describing most of time-varying and non-linear processes occurring in condensed matter with new position.

It is possible in certain materials to induce a condition of formation of a ring electron by means of an external action and/or by nanostructuring of a matter. By that, the resonance conditions of operating of nanoelectronic devices are provided, that allow their functioning at normal and higher temperatures.

Due to reduction of interaction cross-section with ions of a dielectric crystal lattice it is possible to increase the working temperature up to $$T_e = m_e \alpha^3 c^2/2 \text{ k} = 1151.86 \text{ K}(878.71° \text{ C.}). \tag{2}$$

The transition potential of an electron through a barrier Ue=0.09928 V corresponds to this temperature. At coupling of electrons with the unidirectional spins, its energy grows twice.

If electrons with oppositely directed spins couple, the coupling energy, due to the spin turning in space on $\pi$, decreases up to value $$T_\Pi = T_e/\pi = 366.65 \text{ K } (93.5° \text{ C.}). \tag{3}$$

Temperatures $T_e$ and $T_\Pi$ are critical working temperatures depending on the given mode of operations.

The frequency of rotation of an electronic ring will determine the limiting working frequency $$f_e = \alpha^2 c/2\pi r_0 = m_e(\alpha^2 c)^2/h = 3.5037*10^{11} \text{ Hz}. \tag{4}$$

Extreme achievable density of a current is $$j_e = ef_e/\pi r_0^2 = 4\pi e m_e^3 \alpha^8 c^4/h^3 = 3.4*10^4 \text{ A/cm}^2. \tag{5}$$

Maximum allowed field strength, at which disruption occurs is $$E_e = U_e/r_0 = m_e^2 \alpha^5 c^3 / 2e\hbar = 1.37*10^5 \text{ V/cm} \quad (6)$$

The resistance of a material will determine the leakage current of the capacitor, i.e. storage time of energy. The resistance can be calculated per one cluster as follows $$R_e = h/2e^2\alpha = 1.768*10^6 \, \Omega \quad (7)$$

At series connection of the clusters, resistance increases in direct proportion and does not essentially affect the leakage currents of the capacitor, if the intensity of a field is less than $E_e$ and the working temperature is less than $T_e$.

To calculate power parameters of memory cells on nanostructured material consider that clusters have a spherical form and together with a tunnel transparent shell have a diameter $2.175*10^{-6}$ cm. As such, $2.1*10^{11}$ such clusters are disposed on 1 cm$^2$. The cluster has the most stable state when two electrons are in it. Then 1 cm$^3$ of material can store the charge of $2.42*10^{-2}$ C. If the effective voltage $1.37*10^5$ V is impressed to the cube of nanostructured material then in compliance with one the specific accumulated energy in the cube is $W_e = 1.66*10^3$ J/cm$^3$. This value corresponds to $\epsilon = 2*10^6$.

Under writing in memory from such clusters, the limiting density of information will form 28 Gbyte/cm$^2$. The limiting operating temperature of 878° C. and limiting clock rate of 175 GHz will correspond to the writing density.

It is important that electrons of the ring form can make the chains with unidirectional spins or with periodically changing direction spins [5]. In the first case, they determine a metal-semiconductor change of phase, and in another case— they determine semiconductor-superconductor change of phase. However, in a number of cases, for instance, in special way nanostructured material or on the metal surface under large field strength, electronic chains closed by ends and make electronic cluster of the tore form. Such tori can have a diameter up to 2 µm. They are called excitons. They can be seen at the electron leaving in vacuum under action of the external field [10]. The conditions of spatial stability of such excitons are determined by the theorem, proved in work [11].

Essentially, that the excitons in solid in the form of a solitary wave—soliton—can move nondestructively under the action of the control field and can make the corresponding commutation of electrodes.

The essence of the invention is as follows.

In accordance with one embodiment of the invention quantum supermemory is characterized by that it contains at least one memory cell with two or more control electrodes, forming direct or consequent access to the memory cells. Moreover, the memory cell includes at least one cluster and a tunnel-transparent layer. It is characterized by that the cluster has at least one distinctive cross size, determined in an interval $r = a*r_0$, where $r_0$ is determined as ring radius of an electron wave according to the formula $$r_0 = \hbar/(m_e \alpha^2 c) = 7.2517 \text{ nm},$$

where $\hbar$—Plank contstant, $m_e$—electron mass, $\alpha = 1/137,036$—constant of fine structure, c—speed of light, a—factor determined within the range $1 \leq a \leq 4$. The thickness of the tunnel-transparent gap being less than $r_0$, and the spacing between the electrodes being greater than $r_o$.

In the invention, the clusters could be made from material selected from the group consisting of the substances— semiconductor, conductor, superconductor, high molecular organic substance or their combination.

In a number of cases, the clusters could be made in the form of a cavity having a shell of a tunnel-transparent layer, consisting of the semiconductor or dielectric.

In another variant the clusters have centrally symmetric form. Or the clusters can be made extended and have the distinguished cross-sectional size determined by the formula $d = b*r_0$, where $2 \leq b \leq 4$. Also clusters can be made extended along the axis and have regular structure with the period determined by the formula $\tau = b*r_0$, where $1 \leq b \leq 4$.

According to further development of the invention a set of clusters is located regularly at least in one layer, and the intervals between the clusters is tunnel-transparent and do not exceed $r_0$.

According to further development of the invention, the electrodes can be made from conducting material with different electric properties, for example, different photoelectric work function of an electron, various conducting and superconducting properties, etc.

Besides a set of clusters with tunnel-transparent gaps can regular locate as layers, at least, in one of the layers the parameters of the clusters can differ from the parameters of the clusters in the adjacent layers. The intervals between clusters are tunnel-transparent and less than $r_0$.

In another variant, a set of clusters can be made in the form of a cavity having a shell of a tunnel-transparent layer. They contact at least in two points of a cavity with the next clusters and form the material similar to foam with open pores. The shell is made from either semiconductor, or dielectric, or high molecular organic substance, and the pores can be filled either with gas, semiconductor, or dielectric, with properties differing from properties of the material of a shell.

Developing the invention, the cluster or a group of clusters with tunnel-transparent gaps are connected to at least two control electrodes, a set of such clusters with electrodes forms a storage cell matrix with random access.

In another embodiment, a cluster or a group of clusters with tunnel-transparent gaps are connected to at least two control electrodes, a set of such clusters with electrodes forms a re-writable storage cell matrix with random access.

According to another embodiment of the invention, two or more clusters with tunnel-transparent shells are connected to the supply electrodes through at least one resistive layer and/or additional layer of clusters with tunnel-transparent shells and a set of such clusters with electrodes forms the re-writable storage cell matrix with random access.

It is possible to unite clusters in groups not only by their contact, but also with help of electrodes. So, two or more clusters with tunnel-transparent shells are integrated in a group in the form of a series circuit, the even elements of which are connected to a first supply electrode through resistive layers and/or through the layers of clusters, and the odd elements are connected to a second supply electrode through resistive layers and/or through the layers of clusters. The input of the circuit is connected with an input electrode on which information is brought. In addition, an output electrode is connected to the output of the circuit, on which information is read. Such configuration forms the re-writable memory with serial access—an impulse shift register.

The most perspective type of the improvement will be if two or more clusters with tunnel-transparent shells are integrated in a group in the form of a series circuit, to which figured controlling electrodes are connected, the configuration of electrodes will carry information on binary code and simultaneously define preferential direction of the motion of information. An additional electrode is connected to the input of the circuit, which induces start of movement of solitary wave—soliton. The soliton, moving along circuit, reads information from the control electrodes. Such configuration forms the once written memory with serial access. The reading of information is realized here by way of measurement of the current in control electrodes.

For correct selection of optimum parameters of operation of enumerated above variants of the quantum supermemory it is necessary to definite the next requirements.

The field strength per one cluster for work in standby mode should be less than $E \leq E_{max}$, where $$E_{max} = m_e^2 \alpha^5 c^3 / 2e\hbar = 1.37 \times 10^5 \text{ V/cm},$$

and the field strength in charging mode should not exceed $E \leq 2E_{max}$.

The limiting working current density should not exceed $$j_e = 8\pi e m_e^3 \alpha^8 c^4 / h^3 = 6.8 \times 10^4 \text{ A/cm}^2.$$

The limiting clock speed of memory controlling should not exceed $$f_e = m_e(\alpha^2 c)^2 / 2 \, h = 1.752 \times 10^{11} \text{ Hz}.$$

Quantum supermemory with serial access can operate by supplying on control electrodes shifted in time anti-phasing pulsing voltages, forming the electric fields that do not exceed $2E_{max}$. In this case, information moves along the electrode to similarly CCD matrix with two-phase control. To write the information in register it is necessary to supply the electric field on the order of $2E_{max}$-$3E_{max}$ on the input electrode.

For written memory with serial access it is necessary to supply the electric field on the order of $2E_{max}$-$3E_{max}$ on the additional control electrode for soliton initiation in a nanostructured material.

All the itemized devices are illustrated below by the following examples that are depicted in the drawings.

DETAILED DESCRIPTION OF THE PREFERRED EMBODIMENT(S)

Figure 1:
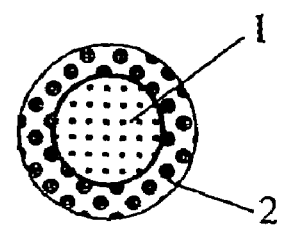
FIG. 1: Spherical element of quantum supermemory with tunnel-transparent shell.

FIG. 1 shows spherical element of a quantum supermemory with a tunnel-transparent shell 2. Cluster 1 is the quantum-size resonator for electron. The resonator Q-factor is $1/\alpha$. The cluster cavity 1 can be filled by the appropriate material or gas for creating the conditions of ring resonant electron formation. Tunnel transparent shell 2 divides clusters among themselves. Cluster 1 can be an axis-symmetric. Chiefly, its cavity has to have the resonance properties for electron.

Figure 2:
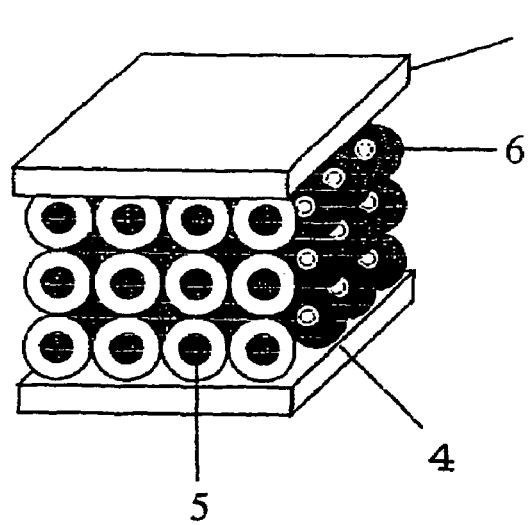
FIG. 2: Quantum supermemory cell on the base of central-symmetric clusters.

FIG. 2 illustrates quantum supermemory cell on the base of central-symmetric clusters. Here clusters 5 with tunnel-transpsrent shells 6 are placed between electrodes 3,4.

Figure 3:
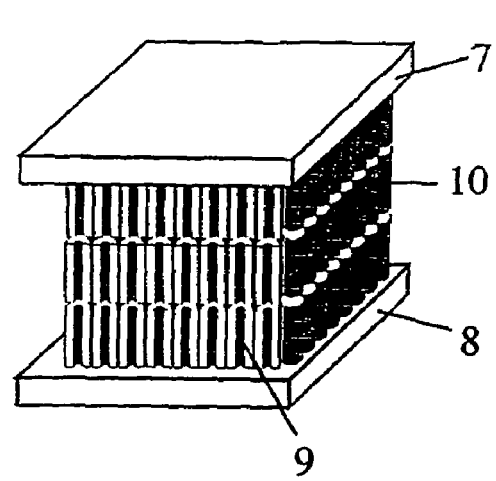
FIG. 3: Quantum supermemory cell on the base of axis-symmetric clusters.

FIG. 3 illustrates quantum supermemory cell on the base of axis-symmetric clusters. Here clusters 9 with tunnel-transpsrent shells 10 are placed between electrodes 7,8. Cluster layers parallel to electrodes are homogeneous, and perpendicular ones can be made from cluster layers of different form and material.

The principle of operation of the memory cells, cited above on FIGS. 2 and 3, is based on charging all clusters in all volume under the action of electric voltage, applied to electrodes 3,4 or 7,8. Cluster charging occurs if the field strength exceeds $E_{max}$ due to electronic wave moving from cathode to anode.

Figure 4:
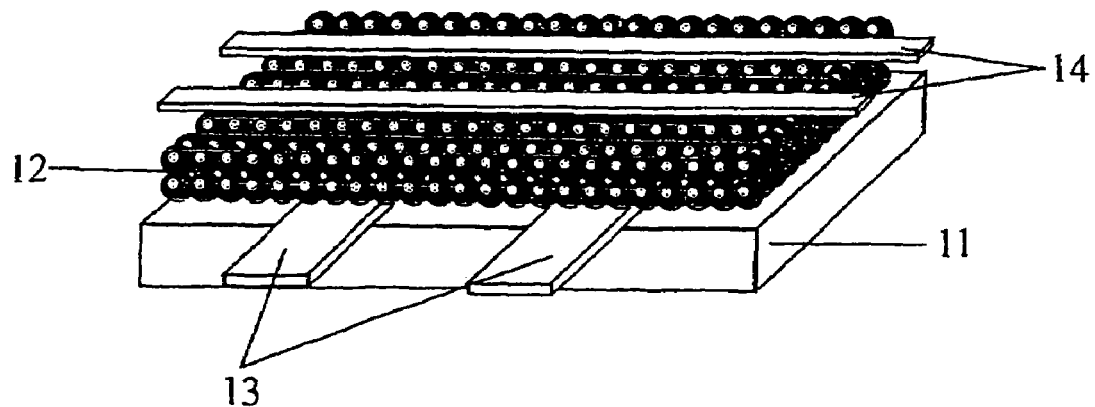
FIG. 4: Fragment of quantum supermemory with random access.

FIG. 4 illustrates a fragment of quantum supermemory with random access. Here on semiconductor or dielectric substrate 11 the nanostructured material 12 and coordinate control electrodes 13,14 are applied. The impulse voltages, exceeding the critical value of the field $E_{max}$ are supplied on two any orthogonal electrodes such that the breakdown of the memory cell located between these electrodes takes place. A part of clusters in a cell is charged with the value of the charge being proportional to time of the impulse action. In this case information can be stored in the cell in discrete analog form. All clusters can be charged if impulse duration is large enough. Then information in the cell will be digital.

There are two ways of reading information from cells. The voltage being supplied on correspondent orthogonal electrodes, the field is made less than $E_{max}$. In this case the variable signal, proportional value of the charge, is induced because of the induction in electrodes. The cell discharge occurs under supplying on the electrodes impulse voltage opposite in sign. Voltage is large enough to destroy the condition of the ring electrons formation. If clusters layers are made with different resonance parameter for electron, information reading will occur layerwise. However, residual charge remains in each cell.

Figure 5:
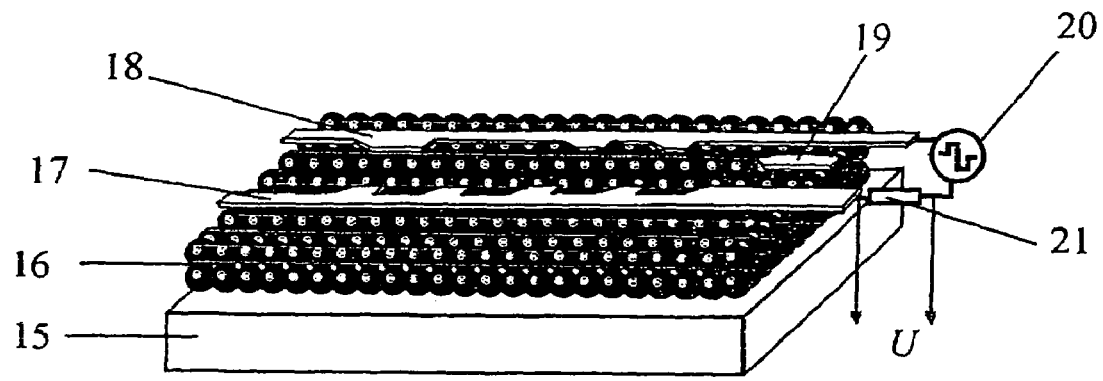
FIG. 5: Fragment of once written quantum supermemory with serial access.

FIG. 5 illustrates a fragment of once written quantum supermemory with serial access. Here on semiconductor or dielectric substrate 15 the nanostructured material 16 and figured control electrodes 17,18 are applied. The electrodes configuration 17,18 carries information on binary code and defines the preferential direction of the information motion. The additional starting electrode 19 is connected to an input of the circuit. The clock impulse generator 20 is connected to control electrodes 17,18 through resistor 21. Such configuration forms once written quantum supermemory with serial access. To form electronic soliton in the volume of nanostructured material at each cycle the starting impulse voltage is applied to starting electrode 19. This soliton begins its motion along control electrodes 17,18 under the action of the clock impulse from the generator 20.

The configuration of electrode 17 is a regular periodic structure with the form of the sharpenning on direction of the cluster motion. But configuration of electrode 18 has the structure, which reflects analog or binary information. The electronic soliton, moving between electrodes, forms the current, proportional to the binary code i.e., partly closes these electrodes. The current, moving on electrodes, forms on resistor 21 the output voltages U, proportional to analog or binary information. Such read-only storage is easy-to-use in mass replicated audio and video information and large volumes of information as database.

Figure 6:
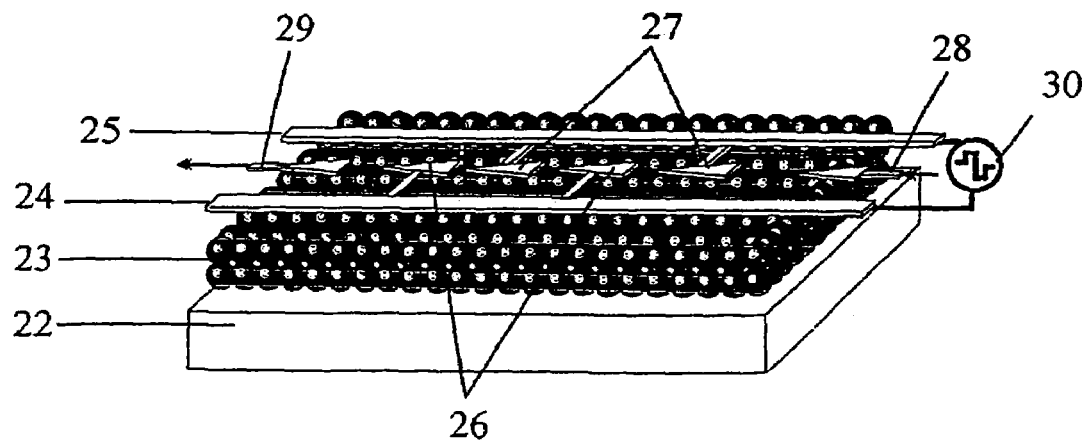
FIG. 6: Fragment of rewritable quantum supermemory with serial access.

FIG. 6 illustrates a fragment of rewritable quantum supermemory with serial access. Here the nanostructured material 23 and control electrodes 24,25 are applied to semiconductor or dielectric substrate 22. Even figured electrodes 26 are connected to control electrode 24, uneven figured electrodes 27 are connected to control electrode 25. The system of electrodes 25, 27 forms an elongated chain. Input information electrode 28 is formed at the beginning of the chain, output information electrode 29 is formed at the end of the chain correspondingly. Control impulse source 30 is connected to control electrodes 24, 25. The source 30 forms control impulses, which consecutively shift information along chain right to left. The high voltage is applied to input information electrode 28 that forms logical "1" or "0". The field strength for forming logical "1" is more than $E_{max}$, and the field strength for forming logical "0" is less than $E_{max}$.

Binary information in the form of charge will move between electrodes similarly CCD register. When the charge reaches the information electrode 29 it will change its potential, which is possible to register. The form of electrodes 26,27 are formed in such a way as to create the condition for motion of information only from input to output. In that way the serial binary register is created. It is possible to create ring-rewritten memory uniting input and output of this register through control elements. It is possible to create the analogues of HDD for computer external storage uniting such ring memory by necessary way. It is important that information in such register is saved when power is off. Under power being on again, the information motion will go with previous saved state.

Embodiment of the Invention

The present invention provides an opportunity for creating energy-independent rewritable memory with the writing density up to 28 Gbyte/cm$^2$, the maximum working temperature being up to 878° C., and the maximum timing frequency being of 175 GHz. These parameters determine a commercial realizability of quantum supermemory. However, the problem is whether it is possible to use the modern techniques for producing the proposed memories and whether the mass-produced devices are economical.

Consider opportunities of technical realization. The description below will show that the creation of offered nanostructured materials for memories as clusters, divided tunnel-transparent intervals is quite feasible on the modern technological base.

There are two methods to form spherical and sphere-like particles [12]. The first method—metal or semiconductor clusters of a diameter up to 37 nm are formed from the gas phase with their further oxidation in the oxygen flow or similar chemicals. Formation of such particle is similar to formation of hail in the Earth atmosphere. The second method is the colloidal method. It is based on cluster precipitation from metal salt solutions following by the chemical coating with corresponding enclosures.

Nanosized hollow spheres of zirconium dioxide are automatically obtained during the process of high-frequency plasma-chemical denitrification; therefore they may be applied to the substrate directly from plasma [13]. 4-15 nm particles result automatically in material Mo$_2$N [14].

The designing planar vertical nanochannels is based on collective formation methods, e.g. according to electrochemical oxidation Al, Ta, Nb, Hf, etc. The formed channel may be filled with metal or semiconductor by the galvanic technique [15].

The mentioned above examples show that the modern techniques allow producing nanostructured materials for the quantum supermemory on the basis of existing technologies.

Besides, in microelectronics there are fulfilled ways of creation on silicon gigabite memory. It is possible to apply nanostructured material to increase storage time and reduction of the sizes of cells of such memory. It can directly be plated on cells of memory from a gas phase through open windows of a mask. In this case it is possible on the same surface of silicon to receive greater volume of memory or its smaller power consumption. It is especially important, that it is possible to receive nonvolatile memory. Thus the minimally possible cells of memory for the perspective integrated circuits will not exceed the size one cluster with a shell, i.e., about 30 nm. It is important, that this size is a fundamental limit for the electronic circuits using electrons as carriers. Below this size, to create elements of the integrated circuits it is impossible due to tunnel effects appearing between control lines.

Information Sources

1. S. M. Sze. Physics of Semiconductor Devices. A Wiley-Interscience Publication John Wiley&Sons. New York. 1981
2. U.S. Pat. No. 5,389,567.
3. U.S. Pat. No. 5,420,746.
4. U.S. Pat. No. 5,677,637.
5. Patent Application PCT BY-99/00012 "Quantum-Size Electronic Devices and Operating Conditions Thereof" (International Publication Number: WO 00/41247, 13.07.2000)
6. U.S. Pat. No. 5,856,907.
7. U.S. Pat. No. 6,180,252.
8. M. Beyer, W. Boeck, K. Moller, W. Zaengl. Hochspannungstechnic. Theoretische und Praktische Grundlagen. Springer-Verlag, 1986.
9. Buzaneva E. V. Microstructures of integral electronics. M. Radio. 1990.
10. Mesyats G. A., Ecton—avalanche of electrons from metal. UFN, No 6, 1995
11. Kapitonov A. N. et. al., Relativistic equilibrium of toroidal medium in eigenfield. Preprint MIFI, 1987.
12. Petrov U. I. Cluster and minor particles. M. Nauka. 1986, 368 pp. (In Russian)
13. Dedov N. V. et al., Structural studies of powders on basis of zirconium dioxide produced by HF-plasmachemical denitration method. Glass and Ceramics. 1991. Np.10, p.17-19J. Phys. Chem. 18. ?15. 1994. P. 4083.
14. J. Phys. Chem. 18. ?15. 1994. P. 4083.
15. Averjanov E. E. Anodization hand-book. M. Mashinostroenie. 1988. (In Russian)

What is claimed is:

1. A rewritable quantum supermemory having serial access, the supermemory comprising:
    a memory cell and first and second supply electrodes providing access to the memory cell, the memory cell including a plurality of clusters each having a tunnel-transparent shell, each cluster has a distinguished size determined within the range 7.25 nm$\leq$r$\leq$29.0 nm, the gap between clusters being less than or equal to 7.25 nm, the spacing between the electrodes being greater than 7.25 nm;
    wherein the clusters are arranged in a plurality of layers including a top cluster layer and a bottom cluster layer, each cluster layer including clusters arranged in rows and columns, the clusters of each cluster layer being in contact with corresponding clusters of adjacent cluster layers;
    wherein the first supply electrode extends in a first direction over the cluster layers and contacts the clusters in odd numbered columns of a given row of the top cluster layer;

wherein the second supply electrode extends in the first direction over the cluster layers and contacts the clusters in an even numbered columns of the given row of the top cluster layer;

wherein the clusters in the given row are integrated in a group in the form a series circuit;

an input electrode connected to an input of the series circuit; and an output electrode connected to the output of the series circuit.

2. The supermemory according to claim 1 wherein each cluster includes material selected from the group of semiconductor, conductor, superconductor, high molecular organic substance or its combination.

3. The supermemory according to claim 1 wherein each cluster includes a cavity, wherein the tunnel-transparent shell of each cluster includes semiconductor or dielectric material.

4. The supermemory according to claim 1 wherein each cluster has a centrally symmetric form.

5. The supermemory according to claim 1 wherein each cluster has an extended form and a distinguished cross-sectional size determined within the range $14.5 \text{ nm} \leq r \leq 29.0$ nm.

6. The supermemory according to claim 5 wherein each cluster extends along an axis and has a regular structure with a period determined within the range $7.25 \text{ nm} \leq r \leq 29.0$ nm.

7. The supermemory according to claim 1 wherein intervals between the clusters in each cluster layer are tunnel-transparent less than 7.25 nm.

8. The supermemory accordingto claim 1 wherein the electrodes include conducting material with different electric properties.

9. The supermemory according to claim 1 wherein at least in one of the cluster layers the parameters of the clusters differ from the parameters of the clusters in adjacent cluster layers, the intervals between the clusters in each cluster layer being tunnel-transparent and not exceeding 7.25 nm.

10. The supermemory according to claim 1 wherein each cluster includes a cavity and the tunnel-transparent shell of each cluster includes either semiconductor, dielectric, or high molecular organic material, and the cavity of each cluster is filled either with gas, semiconductor, or dielectric having electric properties differing from the electric properties of the material of the shell.

11. The process of operating the supermemory according to claim 1, the process including supplying of the electric field $2E_{max}$-$3E_{max}$ on the input electrode for writing the information unit.

12. A once written quantum supermemory having serial access, the supermemory comprising:

a memory cell and first and second control electrodes providing access to the memory cell, the memory cell including a plurality of clusters each having a tunnel-transparent shell, each cluster has a distinguished size determined within the range $7.25 \text{ nm} \leq r \leq 29.0$ nm, the gap between clusters being less than or equal to 7.25 nm, the spacing between the electrodes being greater than 7.25 nm;

wherein the clusters are arranged in a plurality of layers including a top cluster layer and a bottom cluster layer, each cluster layer including clusters arranged in rows and columns, the clusters of each cluster layer being in contact with corresponding clusters of adjacent cluster layers;

wherein the first control electrode extends in a first direction over the cluster layers;

wherein the second control electrode extends in the first direction over the cluster layers;

wherein the clusters of the top cluster layer are integrated in a group in the form of a series circuit, to which the control electrodes are brought, and the configuration of electrodes carries information on binary code and defines preferential direction of the motion of the information; and an additional triggering electrode is connected to the input of the circuit.

13. A process of operating the supermemory according to claim 12, the process including impressing an electric field in an operating range of a field strength, wherein the field strength to one cluster for work in standby mode does not exceed $E \leq E_{max}$, where $$E_{max} = m_e^2 \alpha^5 c^3 / 2e \hbar = 1.37 * 10^5 \text{ V/cm},$$

and the field strength in charging mode does not exceed $E \leq 2E_{max}$.

14. The process of operating the supermemory according to claim 12, the process including restricting the working current density limit by value $j_e = 8\pi e m_e^3 \alpha^8 c^4 / h^3 = 6.8 * 10^4$ A/cm$^2$.

15. The process of operating the supermemory according to claim 12, the process including supplying of the electric field $2E_{max}$-$3E_{max}$ on the additional triggering electrode for soliton initiation.

\* \* \* \* \*

UNITED STATES PATENT AND TRADEMARK OFFICE
CERTIFICATE OF CORRECTION

PATENT NO. : 7,282,731 B2 Page 1 of 1
APPLICATION NO. : 10/482351
DATED : October 16, 2007
INVENTOR(S) : Alexandr Mikhailovich Ilyanok It is certified that error appears in the above-identified patent and that said Letters Patent is hereby corrected as shown below:

Column 11, Line 31, Claim 8:

Delete "accordingto" and insert therefor -- according to --.

Signed and Sealed this

Eighteenth Day of March, 2008

JON W. DUDAS
*Director of the United States Patent and Trademark Office*